(12) United States Patent
Brosnihhan et al.

(10) Patent No.: US 7,083,997 B2
(45) Date of Patent: Aug. 1, 2006

(54) BONDED WAFER OPTICAL MEMS PROCESS

(75) Inventors: Timothy J. Brosnihhan, Natick, MA (US); Michael W. Judy, Wakefield, MA (US)

(73) Assignee: Analog Devices, Inc., Norwood, MA (US)

( * ) Notice: Subject to any disclaimer, the term of this patent is extended or adjusted under 35 U.S.C. 154(b) by 791 days.

(21) Appl. No.: 09/921,456

(22) Filed: Aug. 3, 2001

(65) Prior Publication Data

US 2002/0117728 A1    Aug. 29, 2002

Related U.S. Application Data

(60) Provisional application No. 60/222,751, filed on Aug. 3, 2000.

(51) Int. Cl.
    *H01L 21/306* (2006.01)
(52) U.S. Cl. .................. 438/50; 438/455; 438/739
(58) Field of Classification Search ............ 438/221, 438/296, 48, 50, 406, 405, 421, 424, 219, 438/295, 355, 353, 280, 619, 207, 218, 224; 257/524, 510, 776, 622, 506
    See application file for complete search history.

(56) References Cited

U.S. PATENT DOCUMENTS

| 5,216,490 | A |   | 6/1993  | Greiff et al. |
| 5,343,064 | A |   | 8/1994  | Spangler et al. |
| 5,479,042 | A | * | 12/1995 | James et al. ............ 257/415 |
| 5,725,729 | A | * | 3/1998  | Greiff ..................... 438/50 |
| 5,882,532 | A | * | 3/1999  | Field et al. ............. 216/2 |
| 6,021,675 | A |   | 2/2000  | Seefeldt et al. |
| 6,044,705 | A |   | 4/2000  | Neukermans et al. |
| 6,121,552 | A | * | 9/2000  | Brosnihan et al. ........ 174/253 |
| 6,433,401 | B1 | * | 8/2002 | Clark et al. .............. 257/524 |

FOREIGN PATENT DOCUMENTS

| DE | 198 47 455 A1 | 4/2000 |
| EP | 0 834 759 A2  | 8/1998 |

OTHER PUBLICATIONS

"Embedded Interconnect and Electrical Isolation for High-Aspect-Ratio, SOI Inertial Instruments," Brosnihan et al.; 1997. University of California, Berkeley Sensor & Sctuator Center.

"A Raster—Seanning Full-Motion Video Display Using Polysilicon Micromachined Mirrors"; Conant et al., University of California Berkeley& University of California Davis, Engineering II.

"Integrated Micromachined Scanning Display Systems"; by Hagelin et al., Department of Electrical and Computer Engineering; University of Californian Davis & University of California, Berkeley.

"Stretched-Film Micromirrors For Improved Optical Flatness"; by Nee et al.; University of California, Berkeley Sensor & Actuator Center.

* cited by examiner

*Primary Examiner*—Stephen W. Smoot
(74) *Attorney, Agent, or Firm*—Gauthier & Connors LLP

(57) ABSTRACT

A microelectromechanical system is fabricated from a substrate having a handle layer, a silicon sacrificial layer and a device layer. A micromechanical structure is etched in the device layer and the underlying silicon sacrificial layer is etched away to release the micromechanical structure for movement. One particular micromechanical structure described is a micromirror.

20 Claims, 17 Drawing Sheets

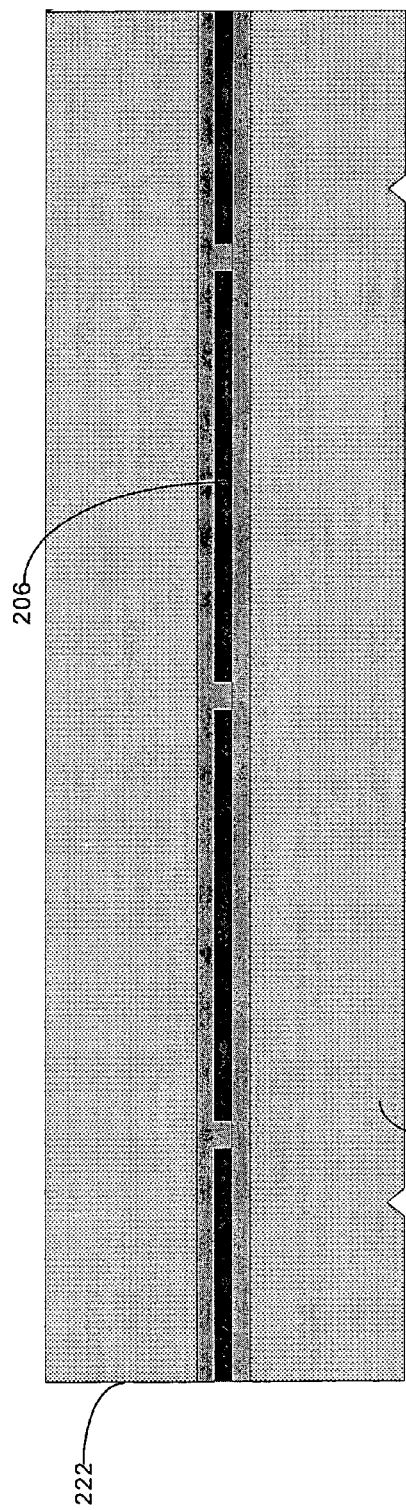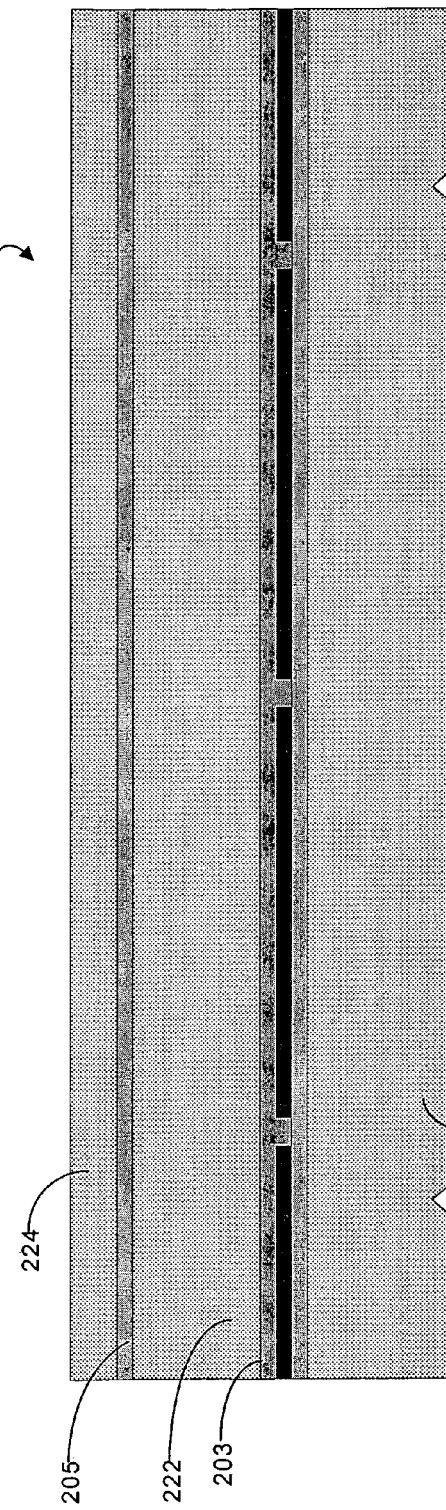
Figure 2a
Figure 2b

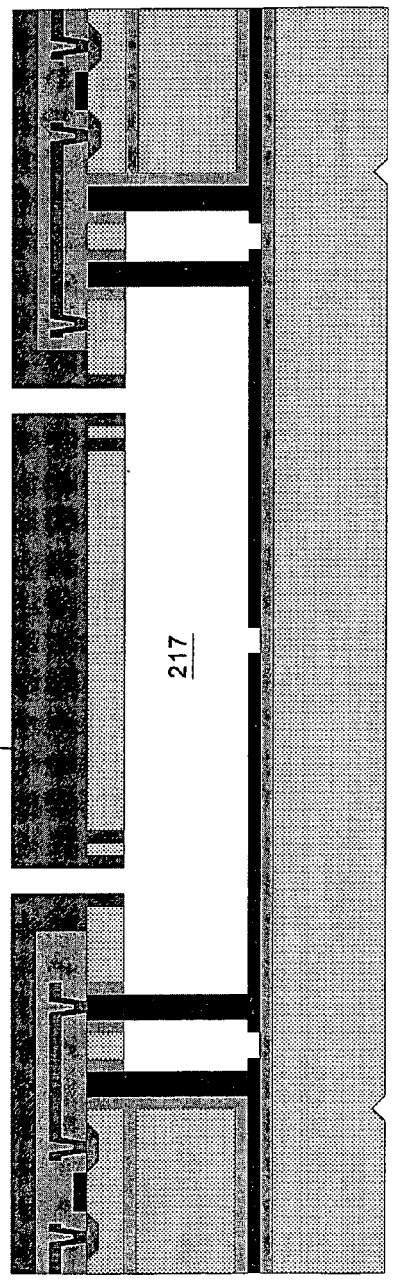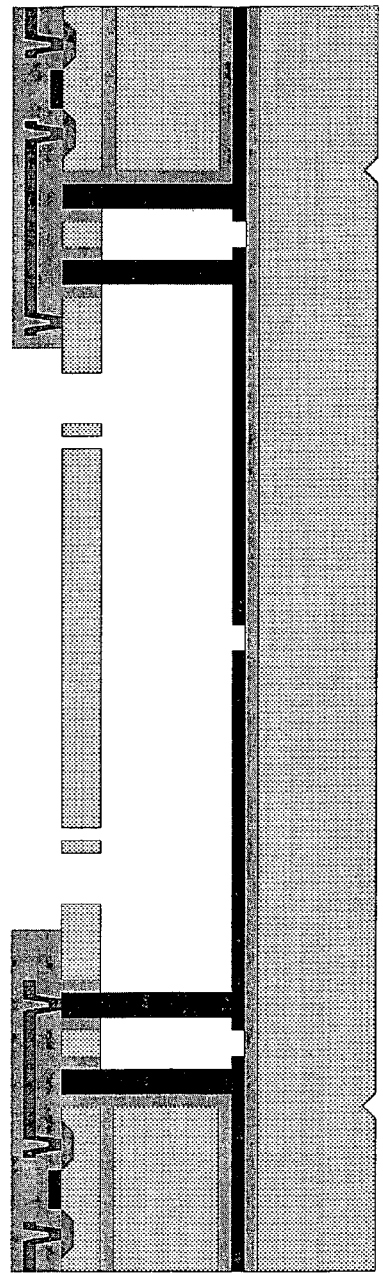
Figure 2i
Figure 2j

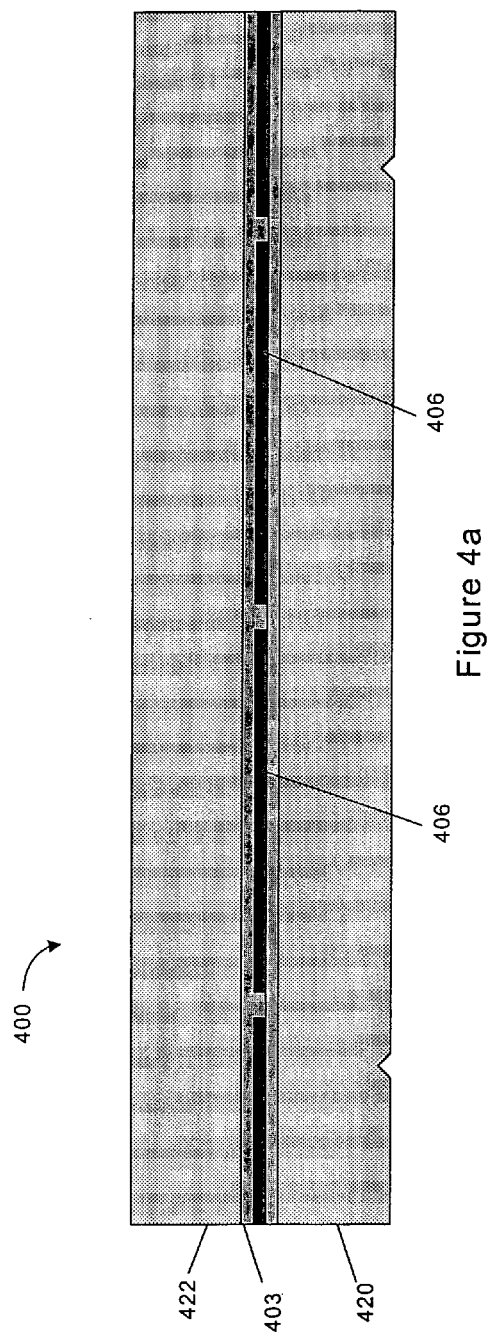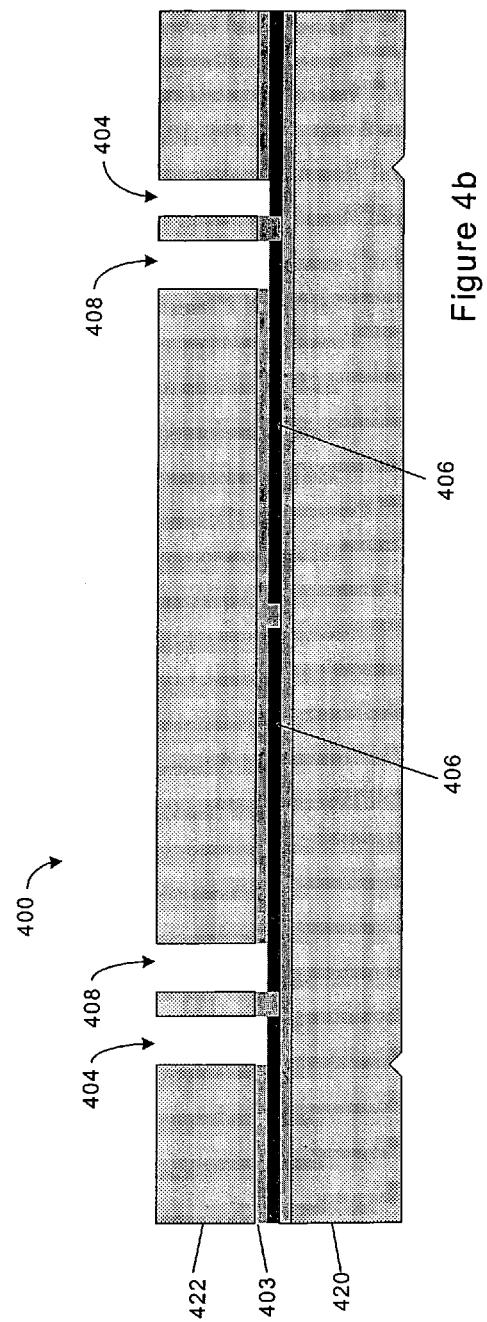

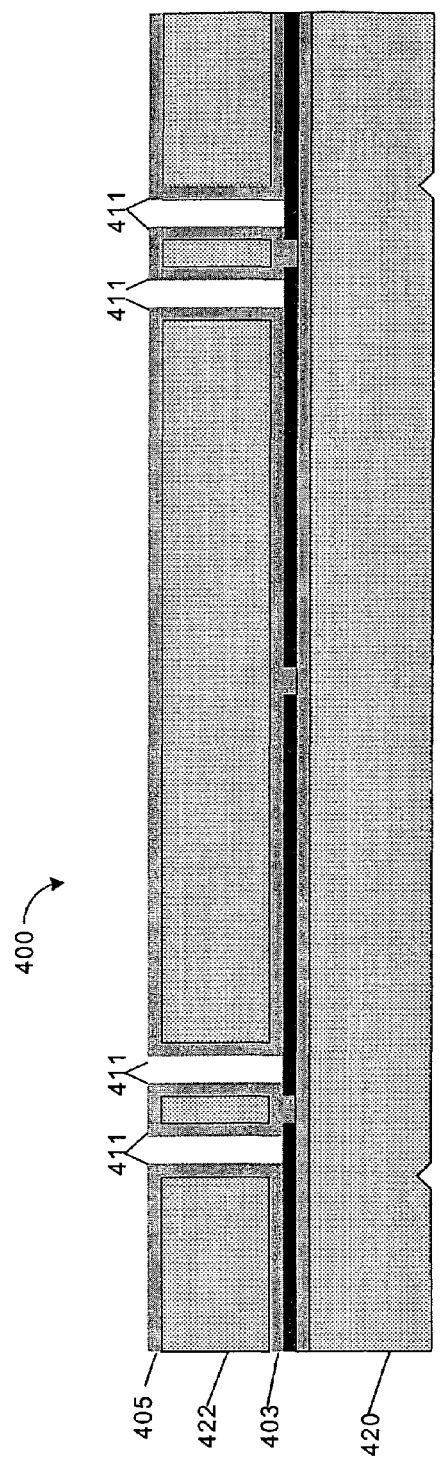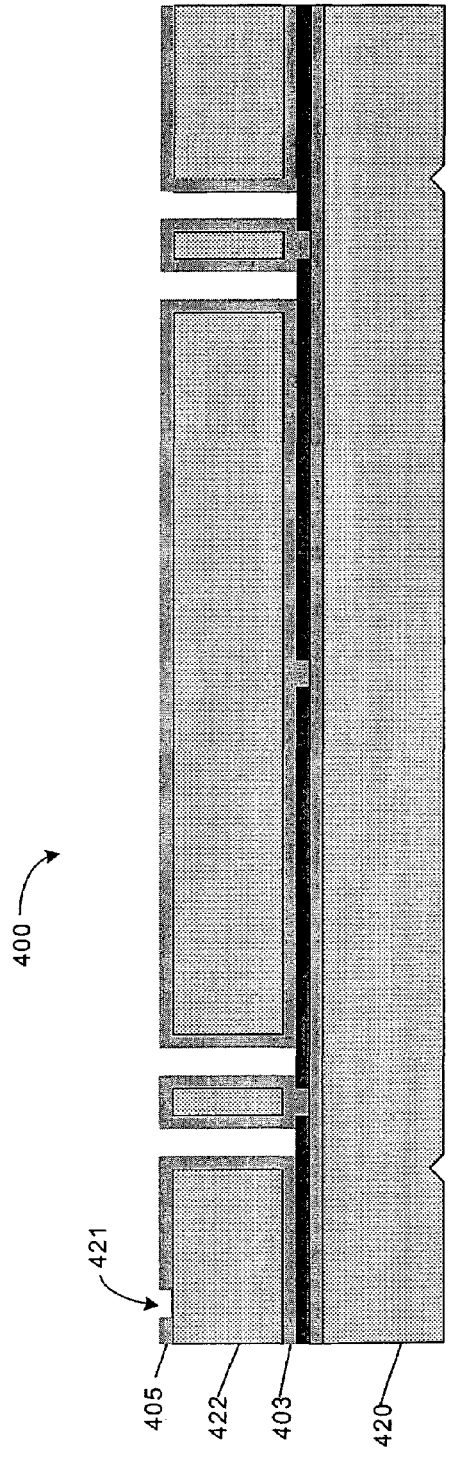

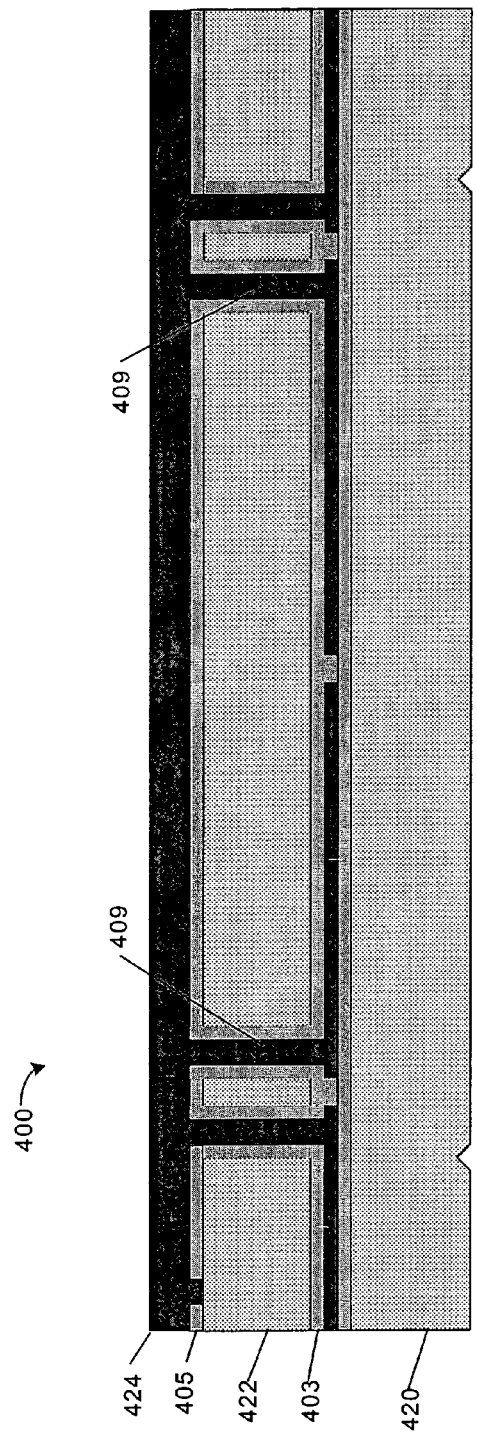
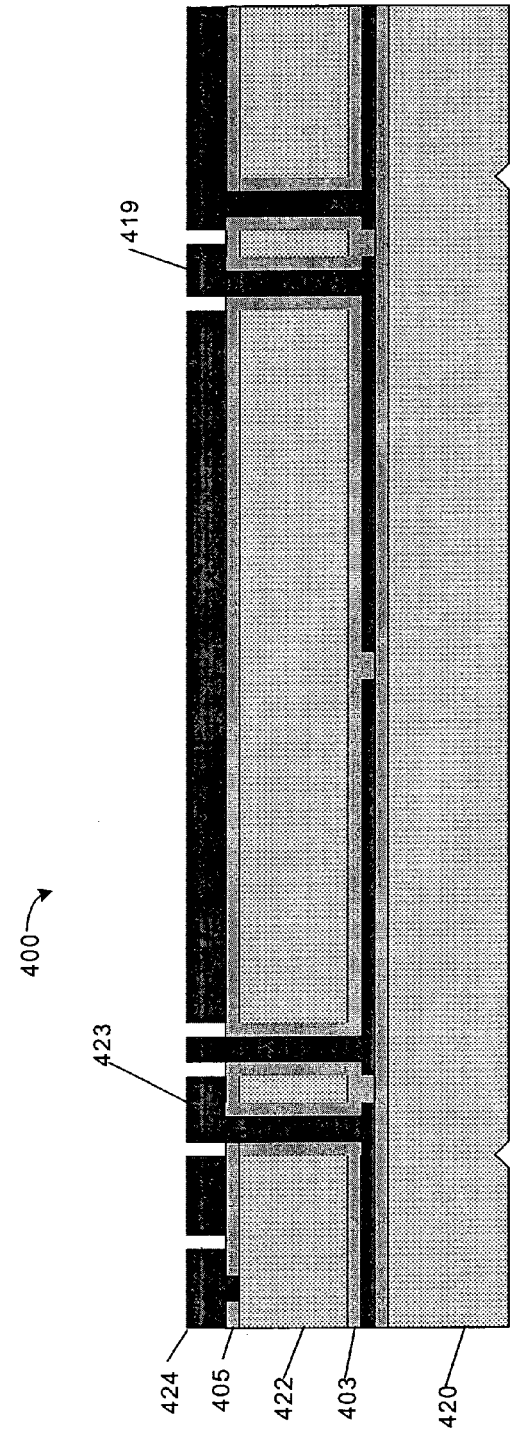

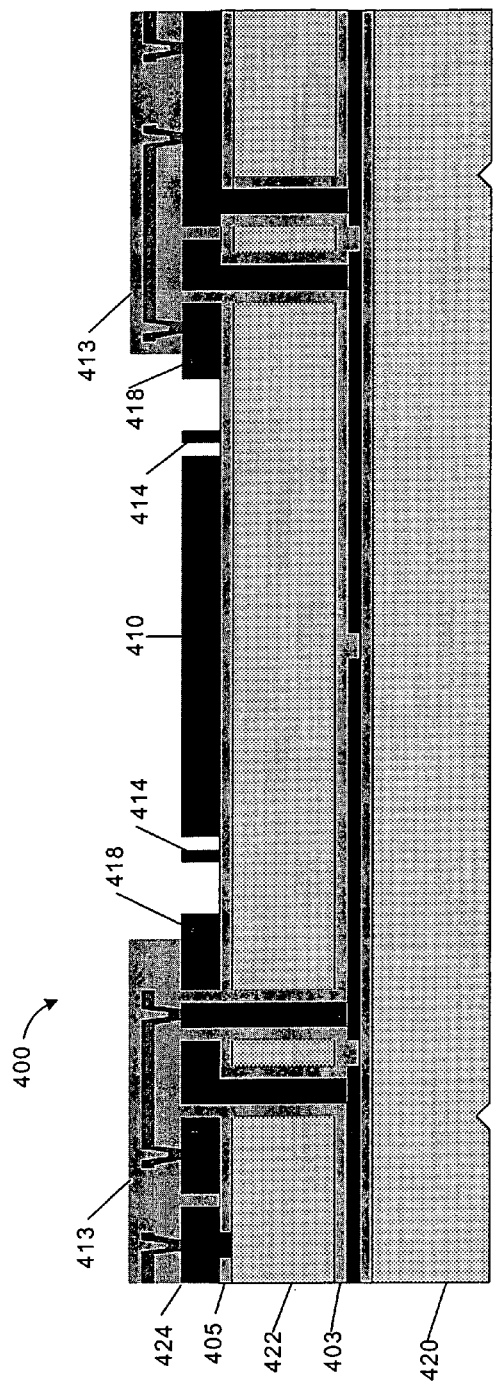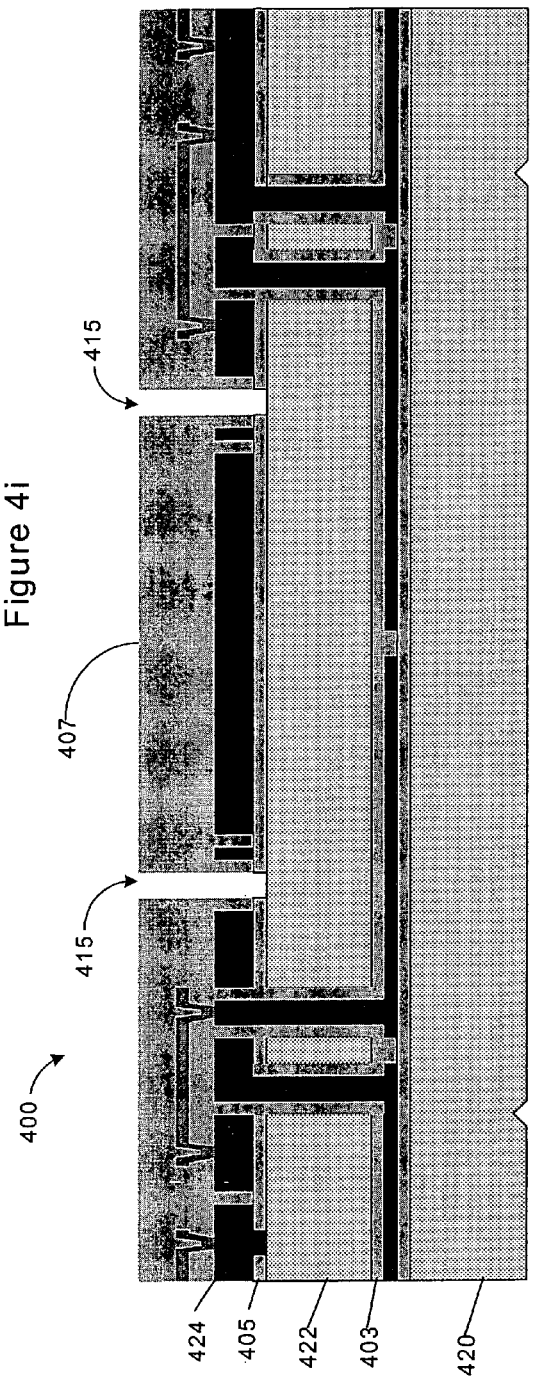

BONDED WAFER OPTICAL MEMS PROCESS

PRIORITY INFORMATION

This application claims priority from provisional application Ser. No. 60/222,751 filed Aug. 3, 2000.

BACKGROUND OF THE INVENTION

The invention relates to the field of microfabricated devices, and in particular to microfabricated devices released to move by removal of a sacrificial layer.

Microelectromechanical systems (MEMS) have a broad range of applications such as, accelerometers, gyroscopes, visual displays and micro-optical systems for fiber-optic communications. The techniques used to form the micromechanical structures, such as surface micromachining, borrow technologies like thin film deposition and photolithography from the microelectronics fabrication industry.

In surface micromachining, thin films of material are typically deposited on a surface (typically known as the handle layer) using a variety of methods to form a device layer of material on a sacrificial layer of material. The micromechanical structure is then formed by patterning and etching the device layer. After the micromechanical structure is formed, a release etch is performed to remove the sacrificial material so that the micromechanical structure is released, allowing it to move and perform mechanical functions.

One actuation scheme used to move the micromechanical structure or otherwise cause it to perform its mechanical function is electrostatic actuation. Electrostatic actuation is commonly used because it does not require complicated fabrication techniques or abnormal materials, such as piezoelectric materials. Electrostatic actuation moves the micromechanical structure by electrostatic attraction between two structures with different voltages applied thereto. When the voltages are applied, the structures move to increase their capacitance by increasing the overlap area of overlapping features, or by closing the gap between the overlapping features.

Because surface micromachining lends itself naturally to creating overlapping surfaces coupled, at least in part, with the common use of electrostatic actuation has resulted in the development of a micromechanical structure used in a number of diverse applications, such as micromirrors, accelerometers, gyroscopes, etc. This structure comprises a plate formed in the device layer that is coupled via flexure assemblies to a frame formed in the device layer. The plate is released to suspend above the handle layer by the removal of the sacrificial layer underlying the plate.

The distance between the plate and the handle layer, however, limits the actuation range of the plate in this structure. This distance directly corresponds to the thickness of the sacrificial layer. An oxide, such as silicon dioxide is typically used as the sacrificial layer. An oxide, however, cannot be grown sufficiently thick to provide the desired actuation range for some applications of this structure.

One such application is micro-optical structures, such as micromirrors. While small deflections suffice for some micromirrors, large micromirrors (greater than about 300 um in diameter) require mirror rotations in the tens of microns (e.g., between about 50–80 um) to be useful. An oxide generally cannot provide for the needed separation between the device layer and the handle layer for such mirror rotations. Therefore, most large micromirrors are not made using the above-described structure. Alternative structures for large micromirrors, such as assembled, hinged or bimorph pop-up structures, have a number of disadvantages. They are often difficult to fabricate, are unreliable, provide low-yield and are many times unmanufacturable devices.

Prior art processes for forming micromirrors also suffer from other disadvantages. For example, many require a through-wafer etch to access the backside of structure. These through-wafer etches create fragile final chips. Etch holes through the mirror surface are often required for the release etch. These etch holes increase signal loss due to scattering. In addition, the prior art processes are not easily integrated with foundry electronics and cannot provide a single chip solution, i.e. one where no assembly is required of separate mirror and electronics chips. The prior art forms micro-optic MEMS systems by constructing the mirror structure on one chip, the electronics on a second chip and then using wire bonding to interface the two components to form the micro-optic system. Integration of active electronics on the same wafer as a micro-optical structure would provide a number of advantages.

SUMMARY OF THE INVENTION

In one aspect of the present invention, a method of fabricating a microelectromechanical system is provided. First, a substrate is provided that comprised a handle layer of silicon, a device layer of silicon and a sacrificial layer of silicon disposed between the handle layer and the device layer. Next, a micromechanical structure is formed in the device layer. Then, at least a portion of the sacrificial layer of silicon underlying the micromechanical structure is removed to release the micromechanical structure for movement.

In another aspect of the present invention, a method of releasing a micromechanical structure for movement is provided. The micromechanical structure is etched in a silicon device layer and a silicon sacrificial layer disposed between said micromechanical structure and a silicon handle layer is etched.

Another aspect of the present invention provides a microfabricated device. The microfabricated device comprises a substrate having a device layer; a least one micro-optical device etched on the device layer and released for movement by removal of an underlying sacrificial layer of silicon; and active electronics formed on the device layer.

Provided in another aspect of the present invention is a microelectromechanical device. The device comprises a handle layer of silicon having actuation electrodes formed thereon, a device layer of silicon having a micromechanical structure formed thereon and a sacrificial layer of silicon disposed between the handle layer and the device layer of silicon. The sacrificial layer of silicon has a portion underlying the micromechanical structure removed to form an actuation cavity below the micromechanical structure.

In another aspect, a micromirror device is provided. The micromirror device comprises a substrate having a device layer, a handle layer and a sacrificial layer made of silicon disposed between the device layer and the handle layer and an isolation trench extending through the device layer and the sacrificial layer. The isolation trench defines a mirror region and electrically isolates the mirror region. The micromirror device also comprises a mirror formed from the device layer in the mirror region above actuation electrodes formed on said handle layer. In addition, a cavity is formed below the mirror by removing a portion of said sacrificial layer of silicon.

BRIEF DESCRIPTION OF THE DRAWINGS

FIGS. 2a–2j illustrate the fabrication steps of the micromirror structure of FIGS. 1a–1c;

FIGS. 4a–4m illustrate the fabrication steps of the micromirror structure of FIG. 3.

DETAILED DESCRIPTION OF THE INVENTION

While the various embodiments of the present invention are described with respect to, and some embodiments are particularly advantageous for, the production of micromirrors, the present invention is not limited thereto. As will be appreciated by one of skill in the art, the principles of the present invention are applicable to a number of other devices, such as inertial sensors, pressure sensors, and actuators.

Figure 1A:
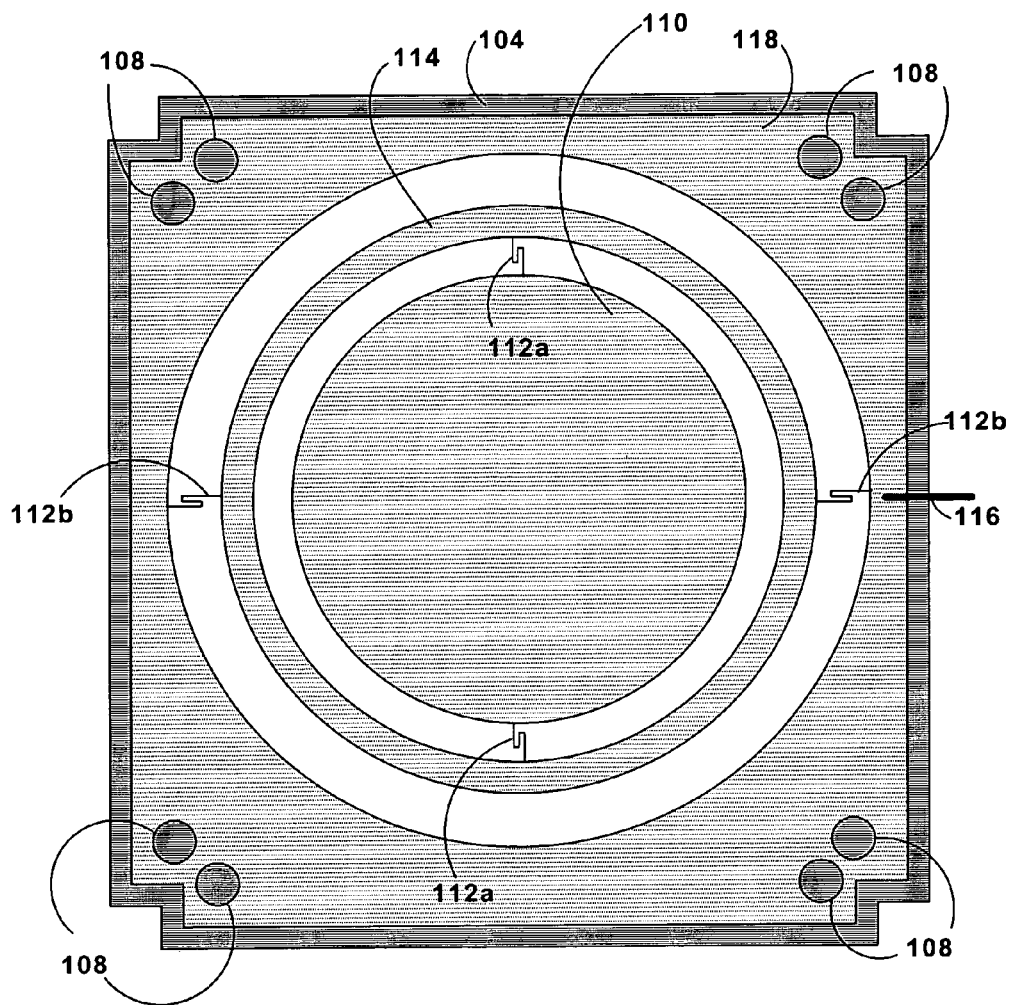
FIGS. 1a–1d illustrate a preferred micromirror structure constructed according to the principles of the present invention in which single crystal silicon is used as the device layer.
Figure 1B:
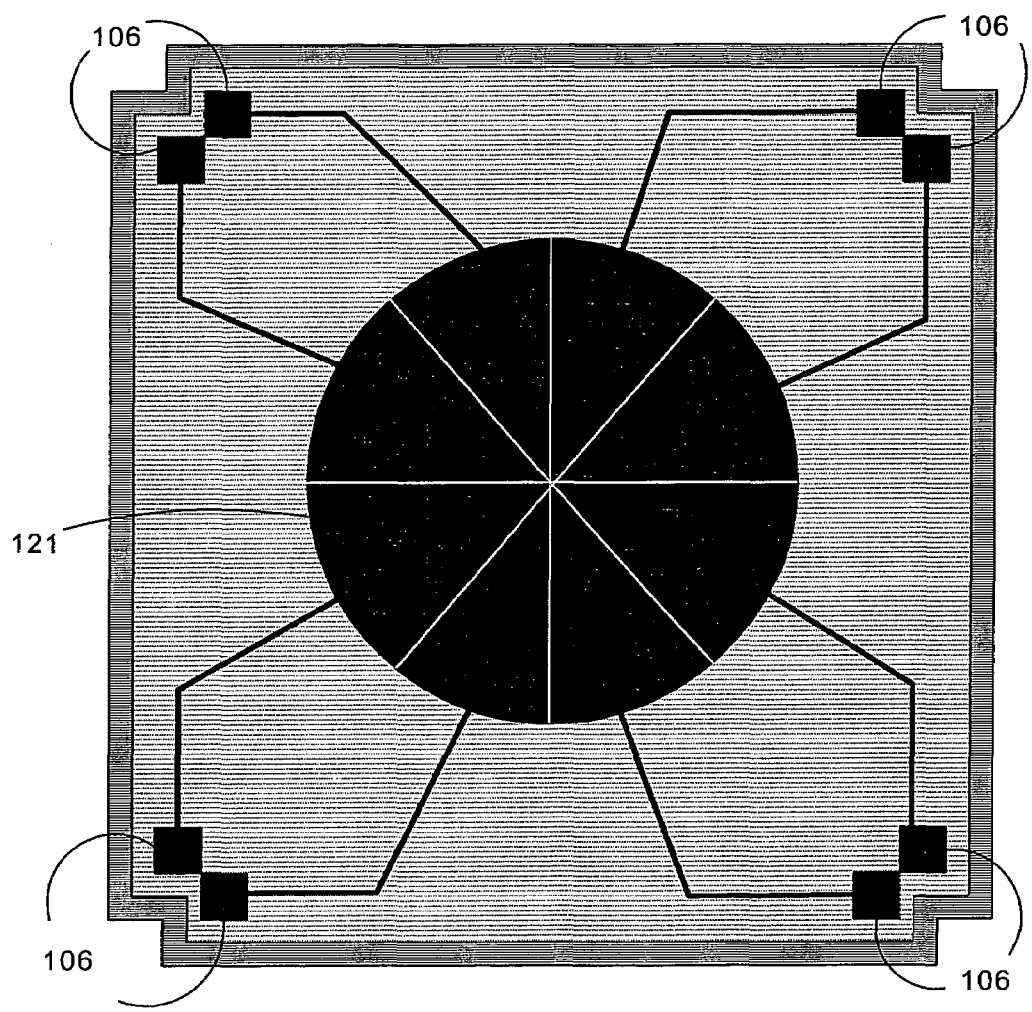
Figure 1C:
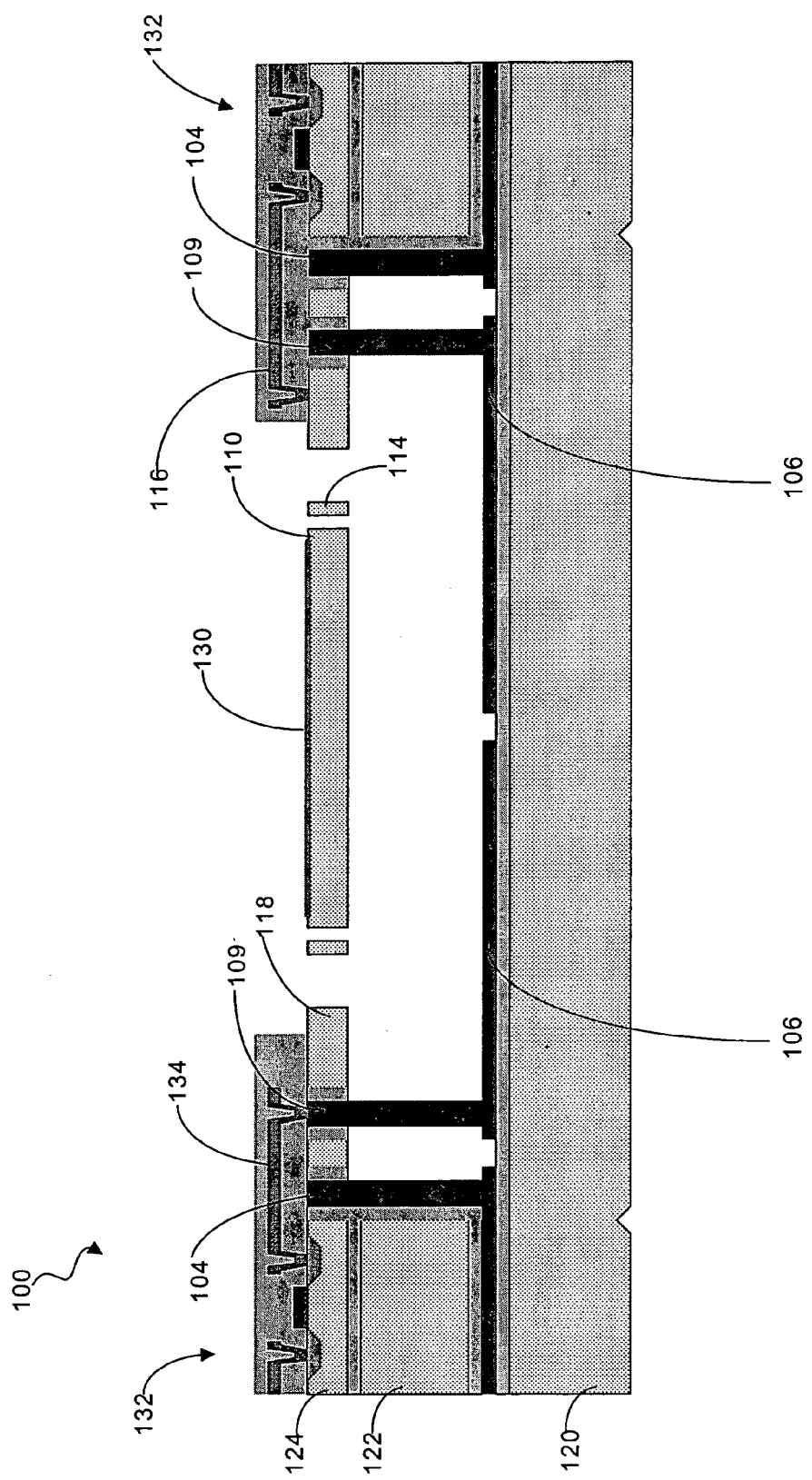

FIGS. 1a, 1b and 1c illustrate a preferred micromirror structure 100 constructed according to the principles of the present invention. FIGS. 1a and 1b illustrate top planar views of different layers of preferred micromirror structure 100. FIG. 1a illustrates a top planar view of the device layer of micromirror structure 100. FIG. 1b illustrates a top planar view of the handle layer of micromirror structure 100. FIG. 1c illustrates a side view of micromirror structure 100.

Micromirror structure 100 is created from a substrate having a handle layer 120, a sacrificial layer 122 and a device layer 124, each separated by a dielectric, such as silicon dioxide. Single crystal silicon is used as sacrificial layer 122 in order to provide for greater distances between mirror 110 and handle layer 120, and, in turn, a greater actuation range. Handle layer 120 and device layer 124 are also single crystal silicon. Significant advantages are obtained with device layer 124 being single crystal silicon. The use of single crystal silicon as device layer 124 provides for larger, flatter mirrors and provides a substrate that is compatible with traditional CMOS fabrication techniques. This allows for control and processing electronics 132 to be formed directly on the substrate. Therefore, it is possible to integrate active electronics on the same wafer as a micro-optical structure.

Figure 1D:
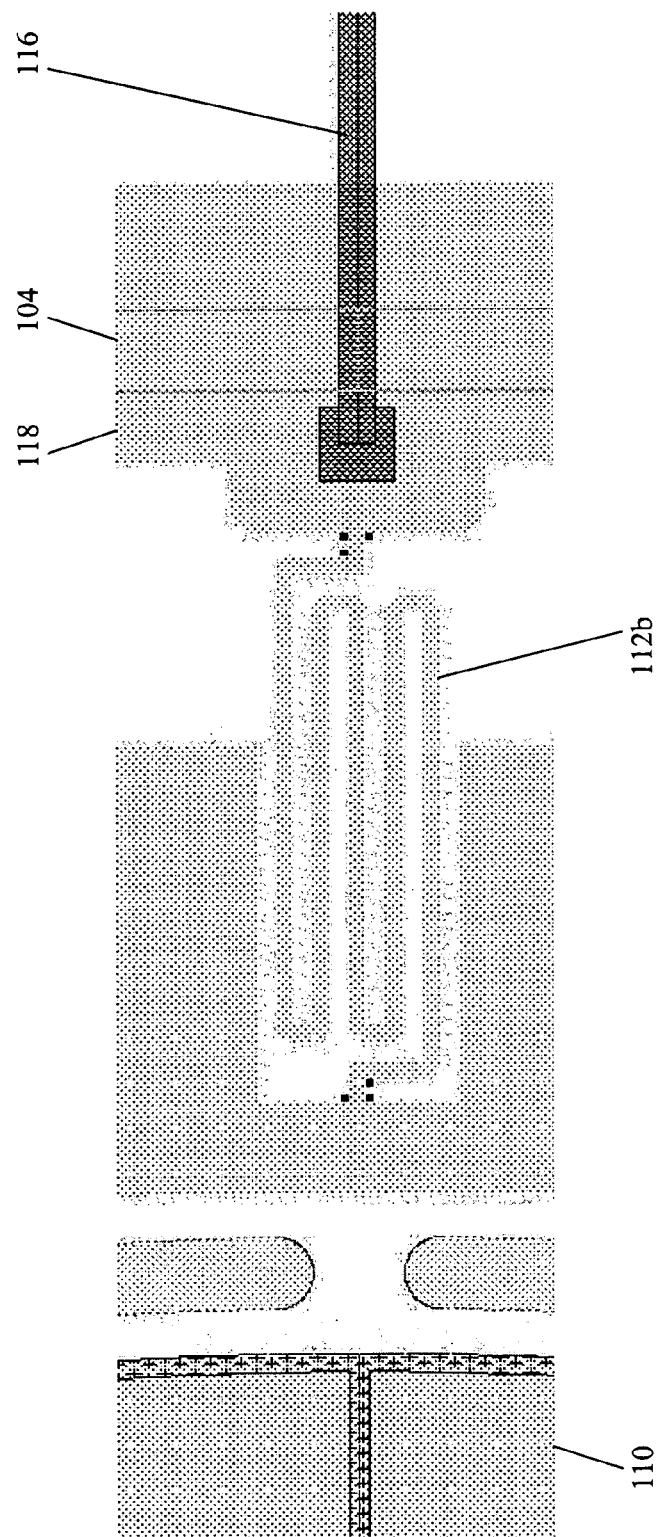

As illustrated, a mirror 110, formed from device layer 124, is suspended over a cavity created by the removal of sacrificial layer 122 underlying mirror 110. Mirror 110 has a coating 130 thereon to increase the reflectivity. Mirror 110 is suspended by flexure connections 112. Preferably, mirror 110 is connected to a concentric suspension ring 114 via a first set of flexures 112a and concentric suspension ring 114 is connected to frame 118 via a second set of orthogonally oriented flexures 112b. Preferably, flexures 112 are serpentine structures as illustrated in FIG. 1d, which shows a close-up of one of the set of flexures 112b.

An isolation trench 104 extends down to handle layer 120 from device layer 124 and surrounds the area containing mirror 110 and associated frame 118. Isolation trench 104 electrically isolates micromirror structure 100 from the rest of the wafer. Further, as will be seen below, isolation trench 104 also acts as a lateral etch stop for the sacrificial layer etch and provides a mechanical anchor for mirror 110.

Similar to isolation trench 104, via posts 109, filled with a conductive material such as doped polysilicon, extend through contact holes 108 down to handle layer 120 from device layer 124. Via posts 109 connect to interconnects 106 formed on handle layer 120. Interconnects 106 have pads at one end for connection to via posts 109 and are connected at the other end to actuation electrodes 121 formed on handle layer 120. An electrical interconnection 116 formed on top of the device layer is used to apply a first voltage to the device layer of micromirror structure 100. Electrical interconnections 134 connected to via posts 109 are then used to apply a second voltage to actuation electrodes 121 to move mirror 110.

Referring to FIGS. 2a and 2b, the fabrication process for micromirror structure 100 begins with a single crystal silicon wafer 222 bonded using wafer bonding to a single crystal silicon wafer 220, which has interconnects and actuation electrodes 206 formed thereon. Interconnects and actuation electrodes 206 are preferably formed using patterned polysilicon. However, other manners of forming interconnects and actuation electrodes 206, such as patterned diffusions into wafer 220, are possible. Alternatively, interconnects and electrodes 206 may be formed on the bottom of wafer 222. Wafer 222 is ground to the desired sacrificial layer thickness (e.g., 50 um) using, for example, a combination of mechanical and chemical-mechanical polishing (CMP). A second wafer 224 is then bonded, also using wafer bonding, to wafer 222 and ground to the desired thickness (e.g., 10 um) of the mechanical structure and the circuits, also using, for example, a combination of mechanical and chemical-mechanical polishing (CMP).

This results in a substrate 200 comprised of a handle layer 220 of single crystal silicon, a sacrificial layer 222 of single crystal silicon and a device layer 224 of single crystal silicon. A first dielectric layer 203 separates sacrificial layer 222 and handle layer 220 and a second dielectric layer 205 separates device layer 224 from sacrificial layer 222.

While described as being formed from three bonded silicon wafers, alternative techniques of forming three-layer substrate 200 are possible. One possible alternative entails wafer bonding a single silicon-on-insulator (SOI) wafer to dielectric layer 203 on wafer 220. In this case, the silicon layer of the SOI wafer above the insulator is made to be the appropriate thickness before bonding and is sacrificial layer 222. The handle layer of the SOI wafer is device layer 224 and is ground to the appropriate thickness after bonding.

Another possible alternative entails double bonding of two SOI wafers to wafer 220. For this technique, a SOI wafer is bonded to wafer 220 and the handle layer of the SOI wafer is removed. This leaves sacrificial layer 222 and dielectric 205. A second SOI wafer is then wafer bonded on top of dielectric 205. The handle layer and insulator layer of the second SOI wafer is then removed to leave device layer 224.

Figure 2C:
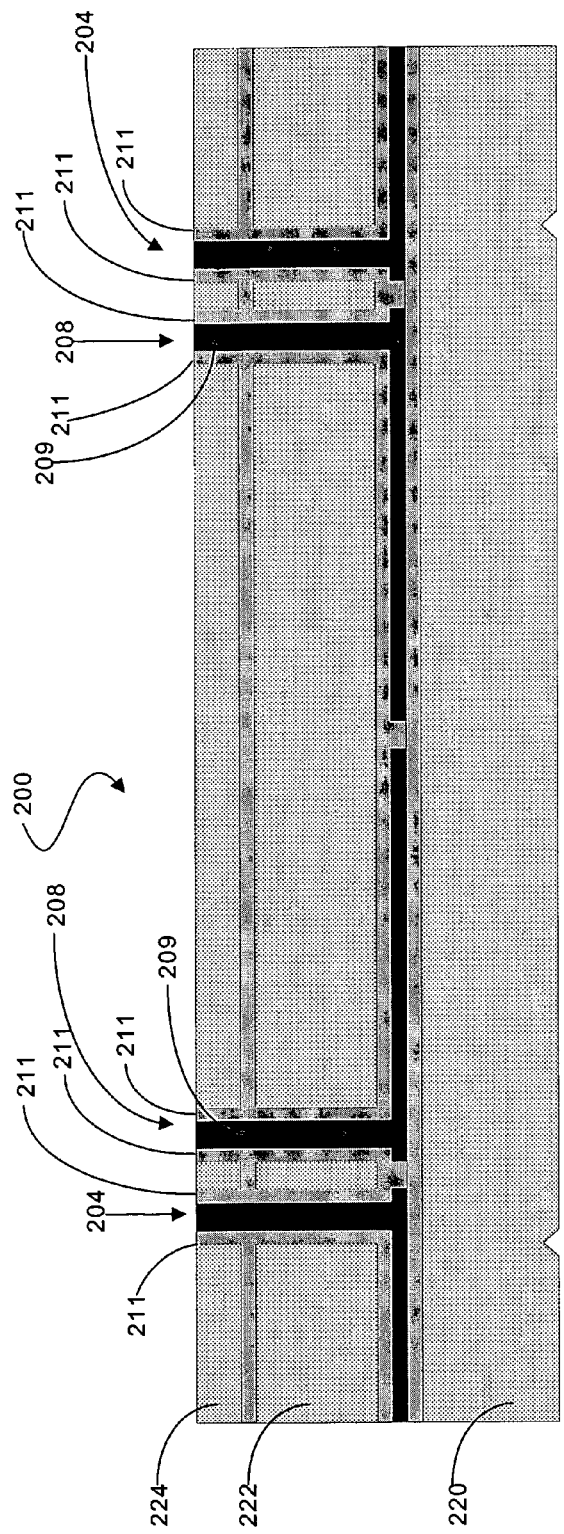
Figure 2D:
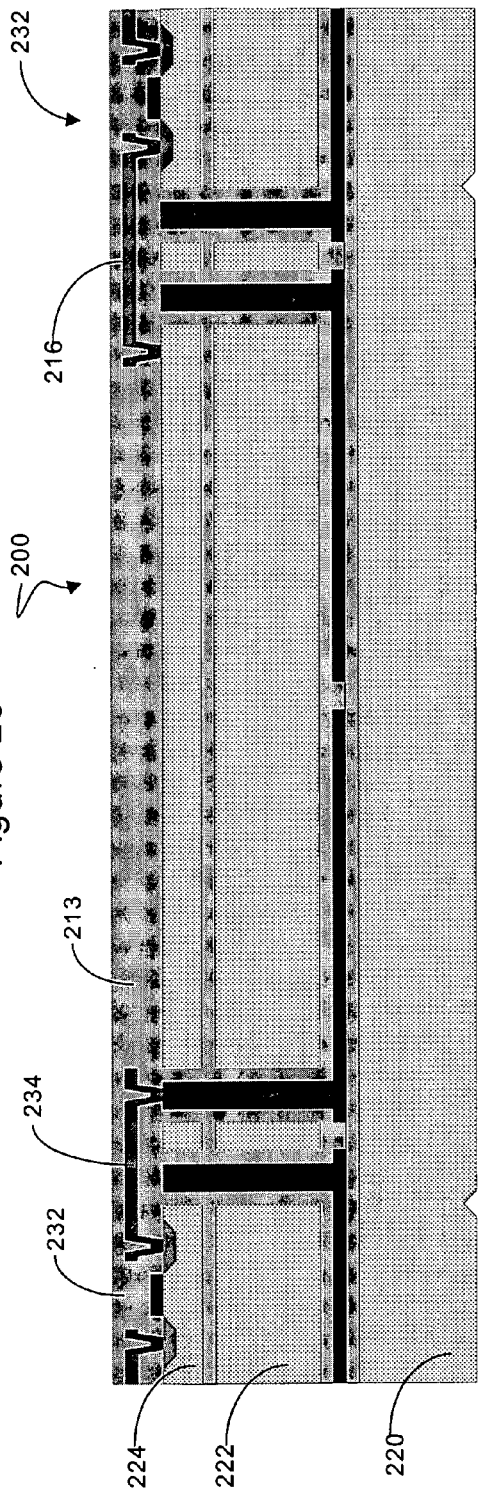

Referring next to FIGS. 2b and 2c, after the fabrication of three-layer substrate 200, isolation trench 204 and contact holes 208 are etched through device layer 224 and sacrificial layer 222, stopping at electrodes 206. While shown as a single isolation trench 204 extending through both the sacrificial layer 222 and device layer 224, the present invention is not limited thereto. For instance, an isolation trench may be formed in sacrificial layer 222, but not device layer 224 and, likewise, an isolation trench may be formed in device layer 224, but not sacrificial layer 222. Or, two trenches that are not coincident may be formed in each of device layer 224 and sacrificial layer 222.

Isolation trench 204 and contact holes 208 are lined with a dielectric 211, such as a thermal oxide, and back-filled with conductive material, such as doped polysilicon. The doped polysilicon in contact holes 208 forms via posts 209. In addition to providing electrical conductivity, the use of doped polysilicon also provides mechanical stiffness to micromirror structure 100.

Figure 2E:
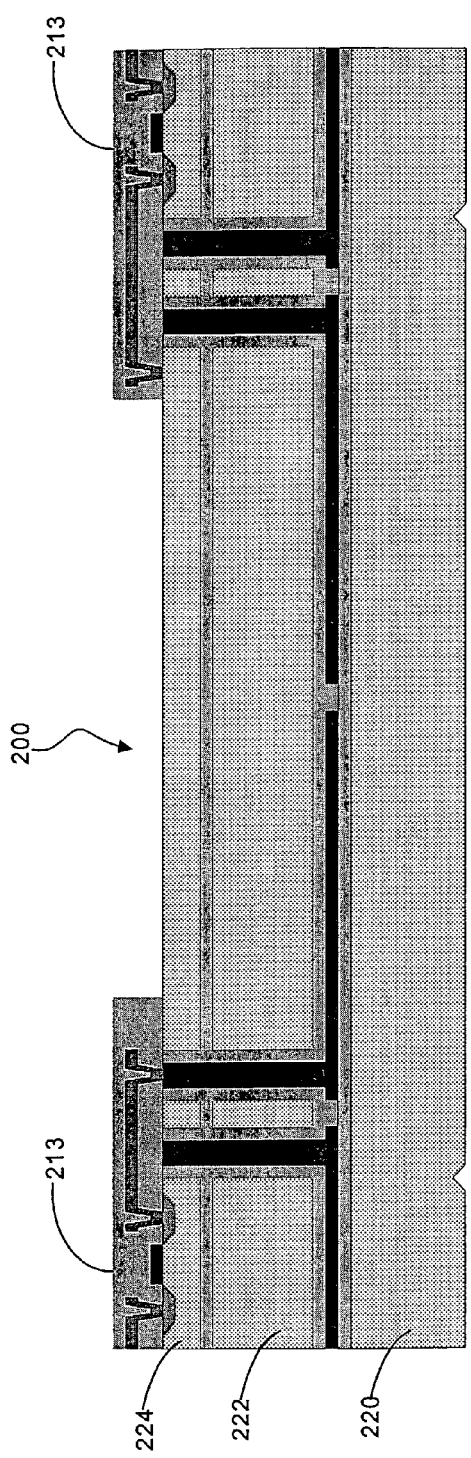
Figure 2F:
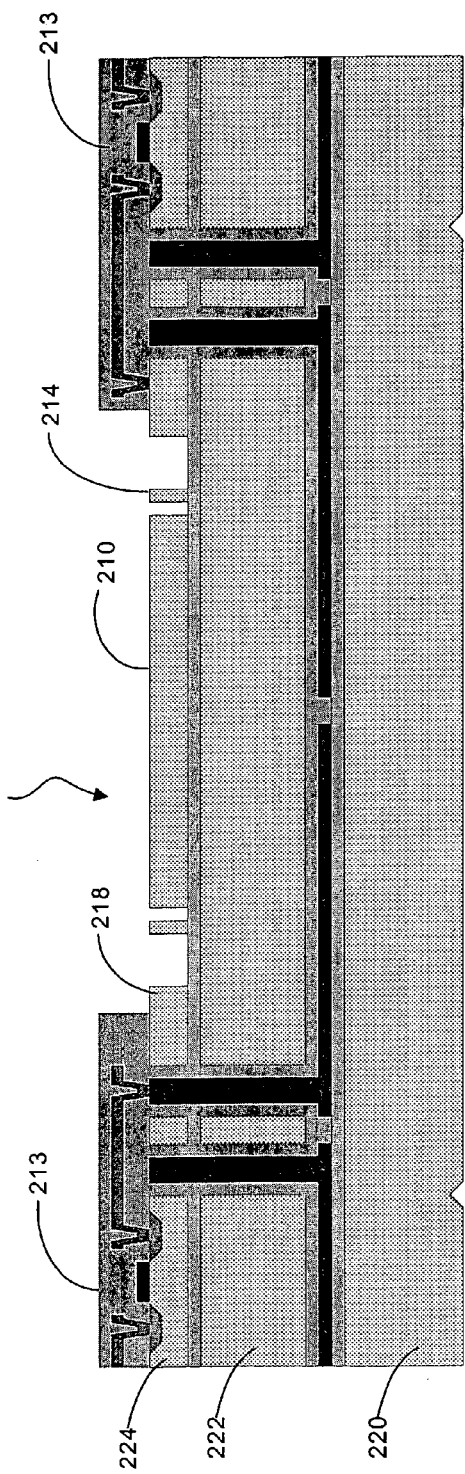

At this point substrate 200 is compatible with traditional CMOS circuit fabrication processes. For a typical CMOS fabrication process, the only differences between substrate 200 and normal starting material is that substrate 200 has trench isolation and comprises bonded wafers. Trench isolation and bonded wafers, however, are well-established processes in IC manufacturing. Therefore, standard processing with alignment to the trench features is preferably performed to form the integrated electronics 232. Metal interconnects 216 and 234 are formed to connect to via posts 209 and the mirror region. At the completion of circuit formation, the substrate has a passivation layer 213 covering device layer 224. As illustrated in FIGS. 2e and 2f, this passivation layer is next removed from the mirror area and the mirror 210, concentric suspension ring 214, frame 218 and flexures are patterned and etched in device layer 224. Mirror 210, concentric suspension ring 214, frame 218 and flexures are etched in device layer 224, for example, using a deep reactive ion etch stopping on second dielectric layer 205

Figure 2G:
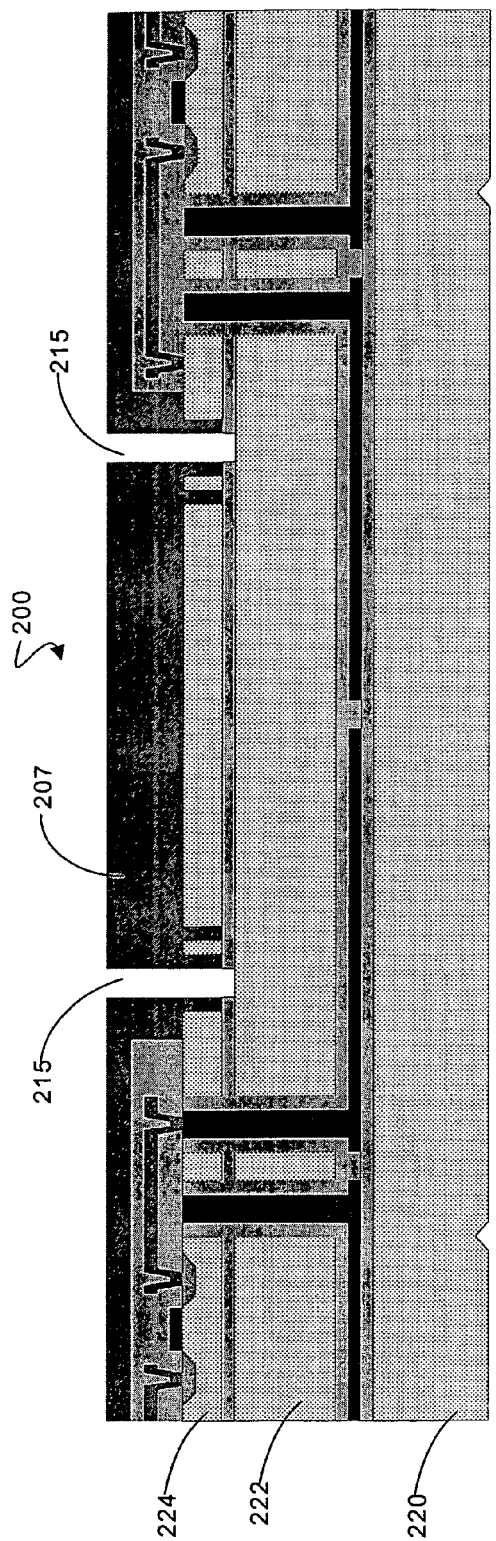

Next, as shown in FIG. 2g, a photoresist coating 207 is applied to substrate 200 and patterned. Release holes 215 are etched through photoresist coating 207 and second dielectric 205 to expose the silicon of sacrificial layer 222.

Figure 2H:
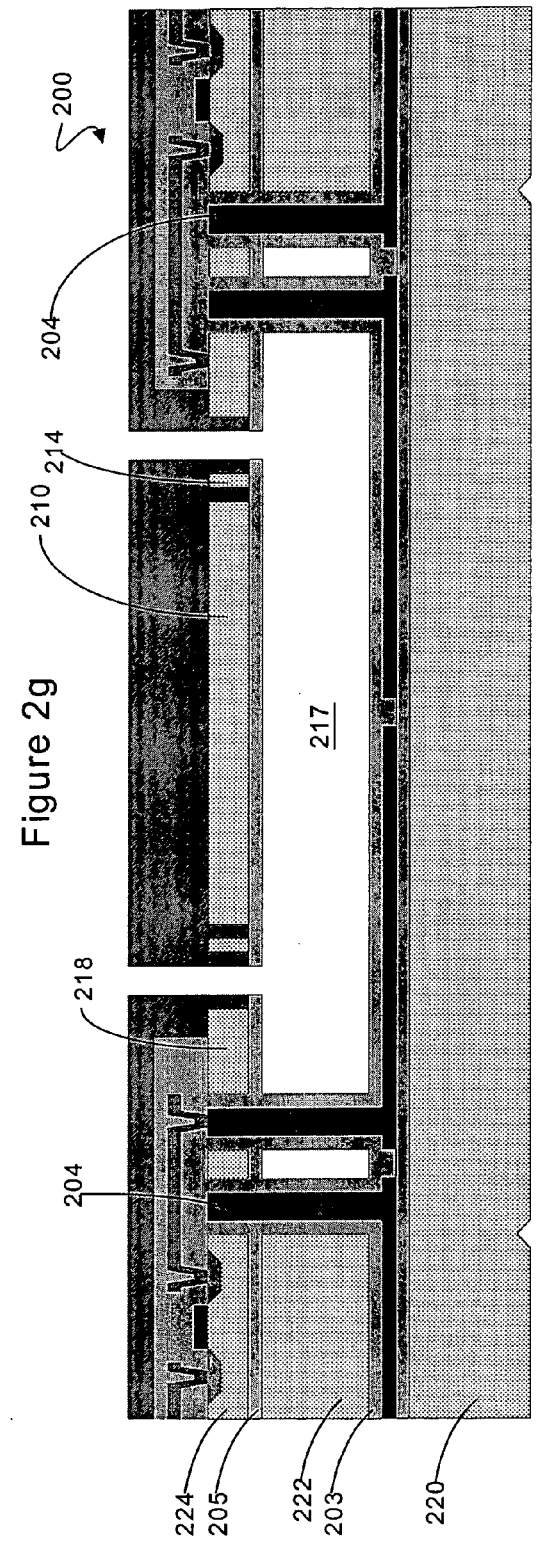

As illustrated in FIG. 2h, the silicon of sacrificial layer 222 bound by first dielectric layer 203, second dielectric layer 205 and the dielectric lining isolation trench 204 is then isotropically etched through release holes 215 using, for example, a Xenon Diflouride ($XeF_2$) dry etch. Etching sacrificial layer 222 forms a cavity 217 underneath mirror 210, concentric suspension ring 214, frame 218 and the flexures. Formation of cavity 217 releases mirror 210, concentric suspension ring 214, frame 218 and the flexures for movement.

Referring to FIGS. 2i and 2j, the dielectric in cavity 217 is next removed by, for example, an oxide etch using Hydroflouric Acid (HF). This is followed by an oxygen plasma resist strip to remove photoresist coating 207, which results in the structure as shown in FIG. 2j. Finally, a layer of reflective material, preferably gold, is deposited and patterned on mirror 210 to complete the structure as shown in FIG. 1c.

While it is preferable to place the coating on mirror 210 as the last step in fabrication, the reflective material can be deposited and etched on mirror 210 or mirror region during other times of the fabrication process. For instance, the reflective material can be placed on the mirror region of device layer 224 prior to the etching of mirror 210, concentric suspension ring 214 and frame 218 and flexures. In this case, after circuit fabrication, part of passivation layer 213 is removed above the mirror region. A thin layer of reflective material, preferably gold, is deposited and patterned on the mirror region. Next, mirror 210, concentric suspension ring 214 and frame 218 and flexures are patterned and etched in device layer 224. The rest of the fabrication continues as previously described to the formation of cavity 217 and the corresponding oxide etch and photoresist strip.

Figure 3:
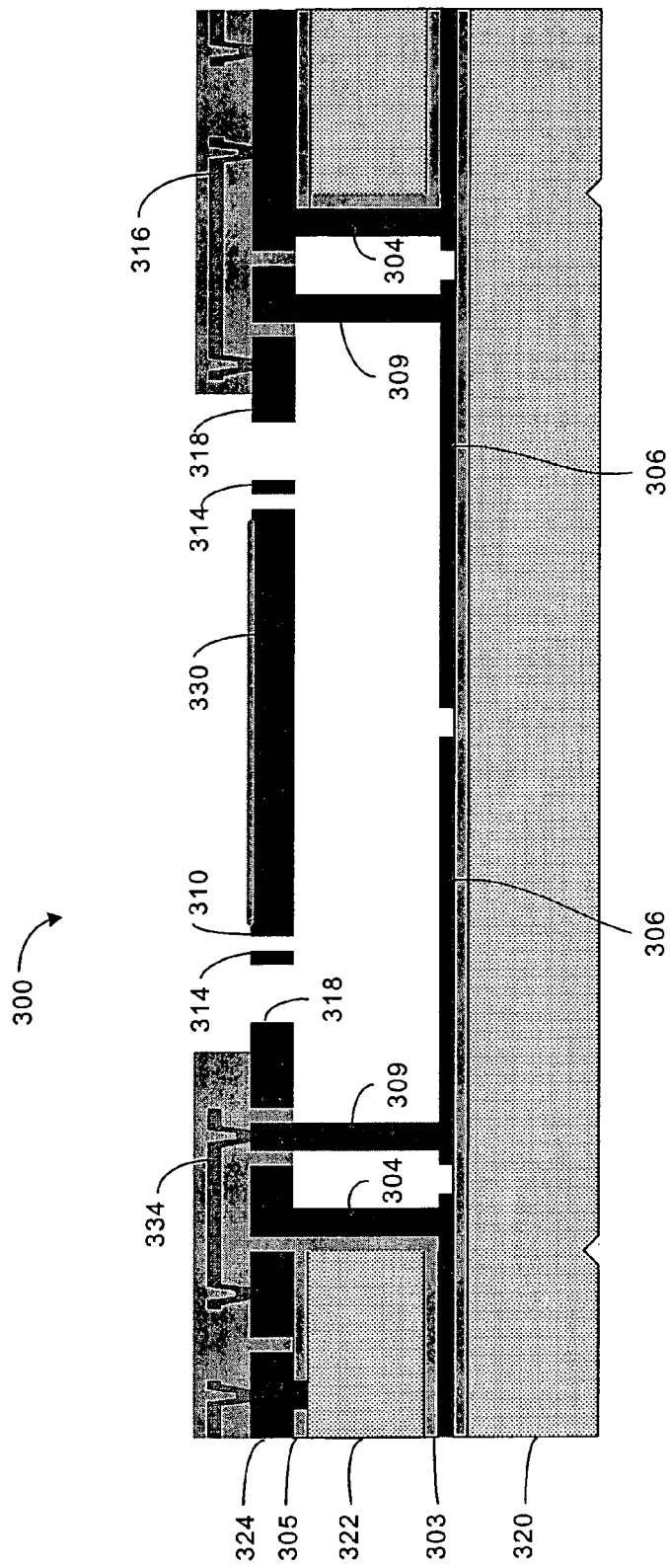
FIG. 3 illustrates another embodiment of a micromirror structure constructed according to the principles of the present invention in which polycrystalline silicon is used as the device layer.

FIG. 3 illustrates another embodiment of a micromirror structure 300 constructed according to the principles of the present invention. In the embodiment of FIG. 3, polycrystalline silicon ("polysilicon") is used as a device layer 324 instead of single crystal silicon. It should be noted that using polysilicon to form a micromirror will increase mirror roughness while reducing compatibility with standard CMOS fabrication. Polysilicon also increases mirror curvature because of stress gradients in the polysilicon. However, the use of polysilicon is advantageous at times because using polysilicon decreases the cost of fabricating the device.

As described, micromirror structure 300 is similar to micromirror structure 100. Micromirror structure 300 is formed from a substrate having a handle layer 320, a sacrificial layer 322 and device layer 324. Handle layer is separated from sacrificial layer 322 by a first dielectric 303, such as silicon dioxide. Polysilicon device layer 324 is separated from sacrificial layer 322 by a second dielectric 305, such as silicon dioxide. Handle layer 320 and sacrificial layer 322 comprise single crystal silicon, while, as described above, device layer 324 comprises polysilicon.

As illustrated, a mirror 310 formed from polysilicon device layer 324 is suspended over a cavity created by the removal of sacrificial layer 322 underlying mirror 310. Mirror 310 has a coating 330 thereon to increase the reflectivity. As with mirror 110, mirror 310 is preferably connected to a concentric suspension ring 314 via a first set of flexures and concentric suspension ring 314 is connected to a frame 318 via a second set of orthogonally oriented flexures. An isolation trench 304 extends down to handle layer 320 through sacrificial layer 322 and surrounds the area containing mirror 310 and associated frame 318. Isolation trench 304 is partially formed from a conductive material, such as doped polysilicon.

Similar to isolation trench 304, via posts 309, filled with a conductive material such as doped polysilicon, extend down through sacrificial layer 322. Via posts 309 connect to interconnects 306 formed on handle layer 320. Electrical interconnections 316 and 334 are formed on top of the device layer to apply the appropriate actuation voltages.

Fabrication of micromirror structure 300 is similar to the fabrication of micromirror structure 100. Referring to FIGS. 4a, 4b, 4c and 4d, the fabrication process for micromirror structure 300 begins with interconnects and actuation electrodes 406 formed on a single crystal silicon wafer 420. Interconnects and actuation electrodes 406 illustrated are formed using patterned deposits of polysilicon. However, as described above, other manners of forming interconnects and actuation electrodes 406, such as patterned diffusions into silicon wafer 420, are possible. A single crystal wafer 422 is bonded to wafer 420 using wafer bonding. Wafer 422 is ground to the desired sacrificial layer thickness using, for example, a combination of mechanical and chemical-mechanical polishing (CMP). Alternative techniques, similar to those described above may also be used to form two-layer substrate 400.

Next, isolation trench 404 and via holes 408 are etched through wafer 422, stopping at interconnects 406. A dielectric, such as a thermal oxide, is grown on top of wafer 422 forming dielectric layer 405 and on the walls of isolation trench 404 and via holes 408 forming linings 411. Anchor holes 421, which will be used provide support to the mirror, are patterned and etched in dielectric layer 405.

As illustrated in FIG. 4e, a device layer 424 and via posts 409 are formed and isolation trenches are filled from polysilicon deposition on top of second dielectric layer 405. Polysilicon forming the device layer is deposited to the desired device thickness. As shown in FIG. 4f, device layer 424 is then etched to form interconnect features 419 and anchor features 423.

Figure 4G:
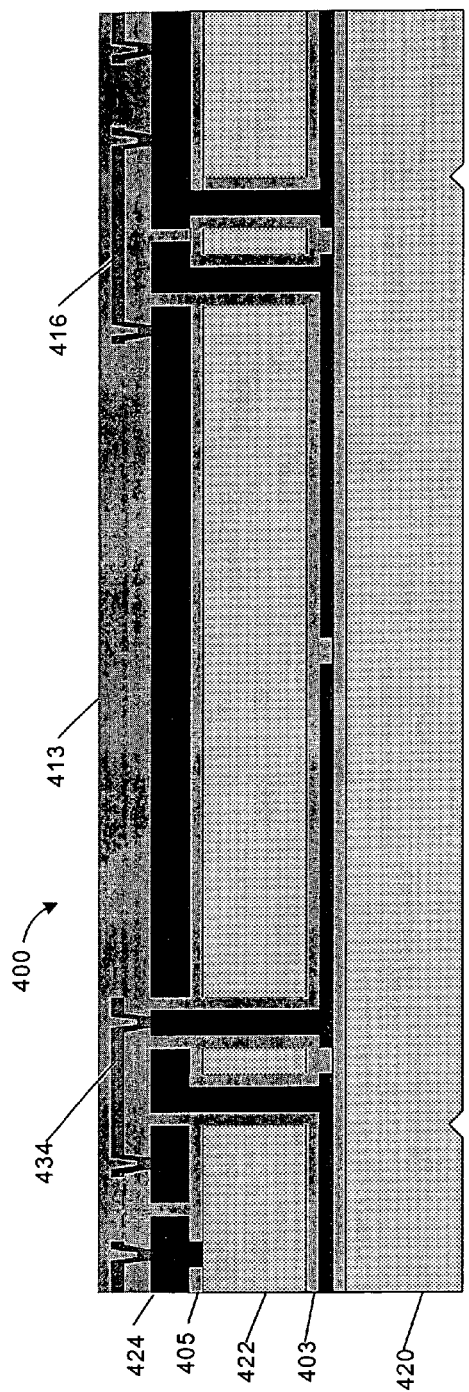

A pre-metal dielectric deposition and contact etch is next performed, followed by a metal deposition and etch step and a passivation deposition step. As shown in FIG. 4g, these steps form metal interconnects 416 and 434 covered by a passivation layer 413.

Figure 4H:
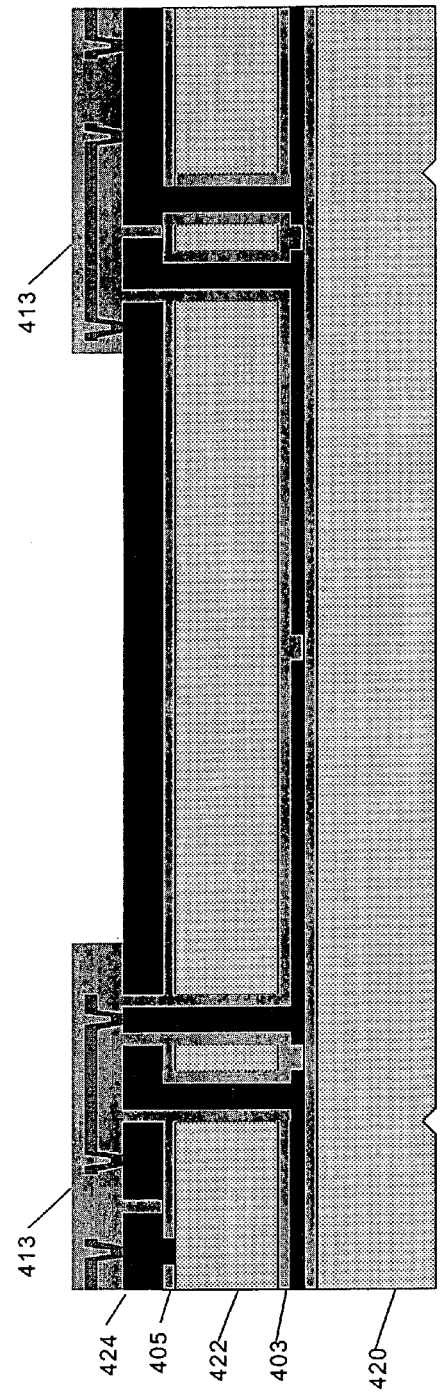

As illustrated in FIGS. 4h and 4i, this passivation layer is next removed from the mirror area and the mirror 410, concentric suspension ring 414, frame 418 and flexures are patterned and etched in device layer 424. Mirror 410, concentric suspension ring 414, frame 418 and flexures are etched in device layer 424, for example, using a deep reactive ion etch stopping on second dielectric layer 405.

Next, as shown in FIG. 4j, a photoresist coating 407 is applied to substrate 400 and patterned. Release holes 415 are etched through photoresist coating 407 and second dielectric 405 to expose the silicon of sacrificial layer 422.

Figure 4K:
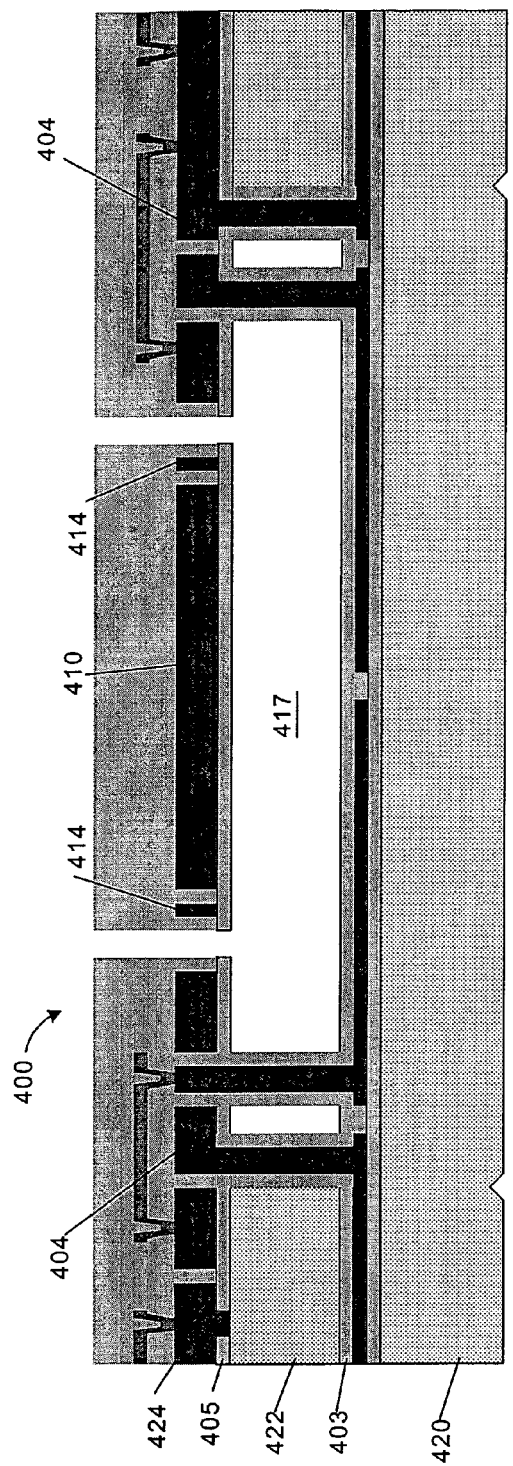

As illustrated in FIG. 4k, the silicon of sacrificial layer 422 bound by first dielectric layer 403, second dielectric layer 405 and the dielectric lining isolation trench 404 is then isotropically etched through release holes 415 using, for example, a Xenon Diflouride ($XeF_2$) dry etch. Etching sacrificial layer 422 forms a cavity 417 underneath mirror 410, frame 418 and the flexures. Formation of cavity 417 releases mirror 410 and the flexures for movement.

Figure 4L:
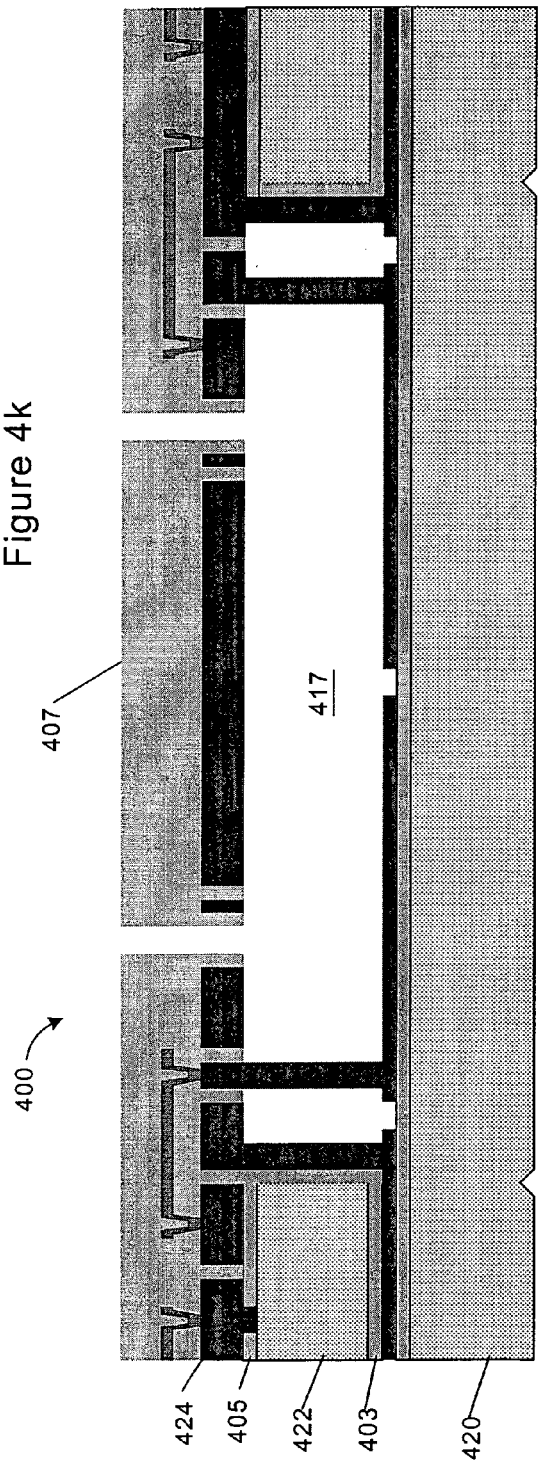
Figure 4M:
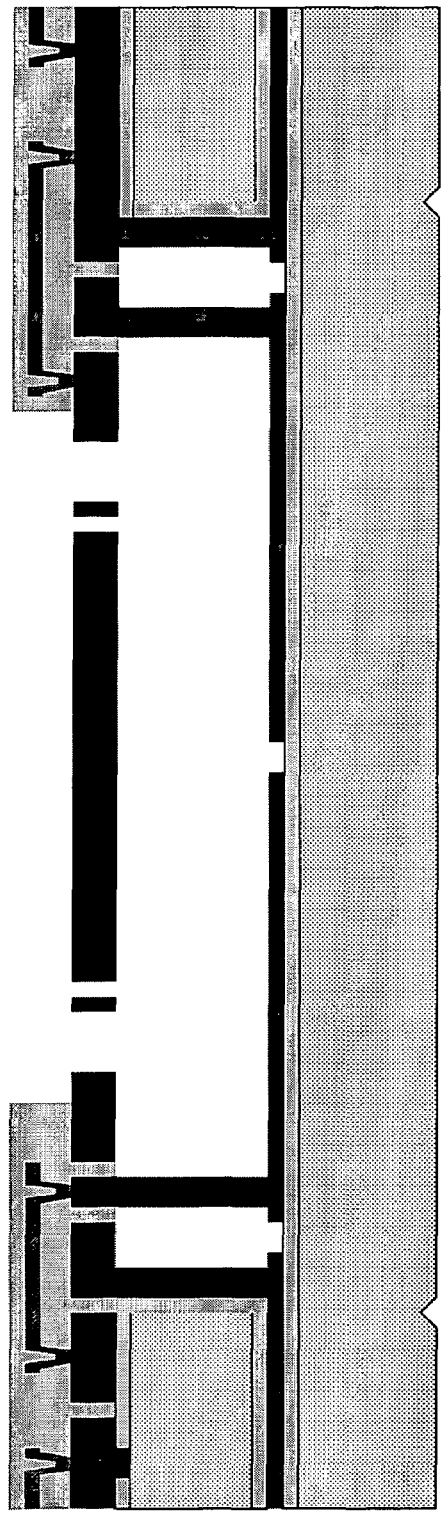

As illustrated in FIG. 4l, the dielectric in cavity 417 is next removed by, for example, an oxide etch using hydrofluoric acid (HF). This is followed by an oxygen plasma resist strip to remove photoresist coating 407 to complete the structure as shown in FIG. 4m. Finally, a layer of reflective material, preferably gold, is deposited and patterned on mirror 410 to complete the structure shown in FIG. 3.

Although the present invention has been shown and described with respect to several preferred embodiments thereof, various changes, omissions and additions to the form and detail thereof, may be made therein, without departing from the spirit and scope of the invention.

What is claimed is:

1. A method of fabricating a microelectromechanical system, said method comprising:
   providing a substrate comprising a handle layer of silicon, a device layer of silicon and a sacrificial layer of silicon disposed between the handle layer and the device layer, the handle layer being separated from the sacrificial layer by a first dielectric layer, the sacrificial layer being separated from the device layer by a second dielectric layer;
   forming an isolation trench that extends through at least the sacrificial layer, the isolation trench defining a release area in the sacrificial layer;
   forming a micromechanical structure in the device layer by etching the silicon of the device layer; and
   removing at least a portion of the sacrificial layer of silicon underlying the micromechanical structure to release the micromechanical structure for movement.

2. The method of fabricating a microelectromechanical system as claimed in claim 1, wherein the silicon of the sacrificial layer is single crystal silicon.

3. The method of fabricating a microelectromechanical system as claimed in claim 1, wherein isolation trench that extends through at-least the device layer.

4. The method of fabricating a microelectromechanical system as claimed in claim 1, wherein the silicon of the device layer is polysilicon.

5. The method of fabricating a microelectromechanical system as claimed in claim 1, wherein the silicon of the device layer is single crystal silicon.

6. The method of fabricating a microelectromechanical system as claimed in claim 1, wherein at least a portion of the sacrificial layer of silicon is removed by:
   placing a photoresist layer on top of the device layer over at least the micromechanical structure;
   forming release etch holes through the photoresist layer and the second dielectric layer; and etching the sacrificial layer of silicon underlying the micromechanical structure.

7. The method of fabricating a microelectromechanical system as claimed in claim 6, wherein the first dielectric layer is used as an etch stop for the etching of the sacrificial layer.

8. The method of fabricating a microelectromechanical system as claimed in claim 6, wherein the second dielectric layer is used as an etch stop for the etching of the sacrificial layer.

9. The method of fabricating a microelectromechanical system as claimed in claim 6, wherein the isolation trench is used as an etch stop for the etching of the sacrificial layer.

10. The method of fabricating a microelectromechanical system as claimed in claim 1, wherein the handle layer has actuation electrodes formed thereon.

11. The method of fabricating a microelectromechanical system as claimed in claim 10, further comprising:
    forming via posts extending through at least the sacrificial layer to contact the actuation electrodes.

12. The method of fabricating a microelectromechanical system as claimed in claim 11, wherein the via posts additionally extend through the device layer.

13. The method of fabricating a microelectromechanical system as claimed in claim 1, wherein actuation electrodes are formed on the bottom of the sacrificial layer.

14. The method of fabricating a microelectromechanical system as claimed in claim 1, further comprising:
    bonding a silicon-on-insulator wafer to a handle wafer of silicon to create the substrate.

15. A method of fabricating a microelectromechanical system, as per claim 1, comprising:
    providing a substrate comprising a handle layer of silicon, a device layer of silicon and a sacrificial layer of silicon disposed between the handle layer and the device layer;
    bonding a first wafer of silicon to a second wafer of silicon and, bonding a third wafer of silicon to the first wafer of silicon, and to create the substrate;
    forming a micromechanical structure in the device layer; and
    removing at least a portion of the sacrificial layer of silicon underlying the micromechanical structure to release the micromechanical structure for movement.

16. The method of fabricating a microelectromechanical system as claimed in claim 1, wherein the said micromechanical structure is any one of a micro-optical device, an inertial sensor, or an an actuator.

17. The method of fabricating a microelectromechanical system as claimed in claim 16, wherein the micro-optical device is a micromirror.

18. The method of fabricating a microelectromechanical system as claimed in claim 1, further comprising:
    etching the silicon sacrificial layer disposed between the micromechanical structure and the silicon handle layer.

19. The method of fabricating a micromechanical system as claimed in claim 18, wherein the micromechanical structure is a micromirror.

20. A method of fabricating a microelectromechanical system, comprising:

providing a substrate comprising a handle layer of silicon, a device layer of silicon and a sacrificial layer of silicon disposed between the handle layer and the device layer;

bonding a first silicon-on-insulator wafer to a handle wafer of silicon and removing a handle layer of the first silicon on insulator wafer to create the sacrificial layer;

bonding a second silicon on insulator wafer to the sacrificial layer and removing a handle layer of the second silicon on insulator wafer to create the device layer;

forming a micromechanical structure in the device layer; and removing at least a portion of the sacrificial layer of silicon underlying the micromechanical structure to release the micromechanical structure for movement.

\* \* \* \* \*